United States Patent [19]

Hamamoto

[11] Patent Number: 5,638,325
[45] Date of Patent: Jun. 10, 1997

[54] CIRCUITRY FOR RESETTING AN ELECTRICALLY ERASABLE MEMORY DEVICE

[75] Inventor: Katsuya Hamamoto, Tokyo, Japan

[73] Assignee: Seiko Instruments Inc., Japan

[21] Appl. No.: 620,891

[22] Filed: Mar. 22, 1996

Related U.S. Application Data

[62] Division of Ser. No. 232,613, Apr. 25, 1994, Pat. No. 5,502,679.

[30] Foreign Application Priority Data

Apr. 28, 1993 [JP] Japan .................... 5-102944

[51] Int. Cl.⁶ .................................. G11C 16/02
[52] U.S. Cl. .................. 365/185.25; 365/185.23; 365/226; 365/228
[58] Field of Search .................. 365/185.25, 185.23, 365/226, 228

[56] References Cited

U.S. PATENT DOCUMENTS

| | | | |
|---|---|---|---|
| 4,905,197 | 2/1990 | Urai | 365/185.25 |
| 5,138,575 | 8/1992 | Ema et al. | 365/185.25 |

*Primary Examiner*—David C. Nelms
*Assistant Examiner*—Andrew Q. Tran
*Attorney, Agent, or Firm*—Adams & Wilks

[57] ABSTRACT

When power is turned off during erasure or writing, electric charge is left due to high voltage. This charge is discharged when the power is turned on. Thus, erroneous erasure, erroneous writing, and erroneous reading are prevented. It comprises a reset circuit 2 for producing a reset signal when the power is turned on, a bias circuit 3 for producing a given voltage during the period of the reset signal, a driver 4 for selecting and driving all word lines with a given voltage during the period of the reset signal, and discharging circuits 5 for electrically discharging all control lines and all bit lines during the period of the reset signal.

3 Claims, 3 Drawing Sheets

5,638,325

CIRCUITRY FOR RESETTING AN ELECTRICALLY ERASABLE MEMORY DEVICE

This is a division, of application Ser. No. 08/232,613 filed Apr. 25, 1994, now U.S. Pat. No. 5,502,679.

BACKGROUND OF THE INVENTION

The present invention relates to an electrically erasable nonvolatile memory, or an EEPROM, having memory cells including selecting gate MOS transistors, control gate MOS transistors, word lines, control lines, and bit lines.

Referring to FIG. 2, a conventional EEPROM has memory cells 1 in which selected word line 101 and control line 111 are set high (20 V) during erasure. At the same time, a control gate 131 selected by these lines is set high. During writing, selected word line 101 and bit line 121 are set high. At the same time, the drain 132 of a control gate MOS transistor 12 selected by them is set high. When the erasure of the writing ends, the supply of the high voltage is stopped. When the erasure ends, the source of the high voltage is kept at ground level (0 V) for a given time (several microseconds) while maintaining the control line 111 and the control gate 131 in selected state. When the writing ends, the source of the high voltage is kept at ground level for a given time while maintaining the bit line 121 and the drain 132 of the control gate MOS transistor 12 in selected state. In this way, when the erasure ends, the selected control line 111 and control gate 131 are electrically discharged. When the writing ends, the selected bit line 121 and the drain 132 of the control gate MOS transistor 12 are electrically discharged.

In the conventional EEPROM, if the power is turned off during erasure or writing, the word lines selected immediately before the power is turned off drop to ground level. The control lines or bit lines selected immediately before the power is turned off are released, i.e., have high impedance. Therefore, electric charge remains either on the control lines and the control gates or on the bit lines and the drains of the control gate MOS transistors due to the high voltage. As a result, erroneous erasure, erroneous writing, and erroneous reading can take place.

Accordingly, the present invention is intended to solve this problem with the prior art techniques. It is an object of the present invention to provide and EEPROM which electrically discharges electric charge when the power is turned on, the charge being left due to high voltage remaining after the power is turned off during erasure or writing, whereby preventing erroneous erasure, erroneous writing, and erroneous reading.

SUMMARY OF THE INVENTION

To solve the above problem, the electrically erasable nonvolatile memory device of the present invention is so configured that is comprises: a reset circuit for producing a reset signal when power is turned on; a bias circuit for producing a predetermined voltage during the period of application of said reset signal; a driver for selecting and driving all word lines with the predetermined voltage during the period of application of the reset signal; and a plurality of discharging circuits for electrically discharging all control lines and all bit lines during the period of application of reset signal. When the power is turned off during erasure of writing, electric charge is left at a high voltage. This charge is discharged through the discharge circuits when the power is turned on. Thus, erroneous erasure, erroneous writing, and erroneous reading are prevented.

In the EEPROM constructed as described above, the driver selects and drives all word lines with a predetermined voltage obtained from the bias circuit during the period of application of the reset signal produced by the reset circuit when the power is turned on. The discharging circuits operate to electrically discharge the respective control gates and bit lines. In this way, erroneous erasure, erroneous writing, and erroneous reading are prevented.

DETAILED DESCRIPTION OF THE PREFERRED EMBODIMENTS

Figure 1:
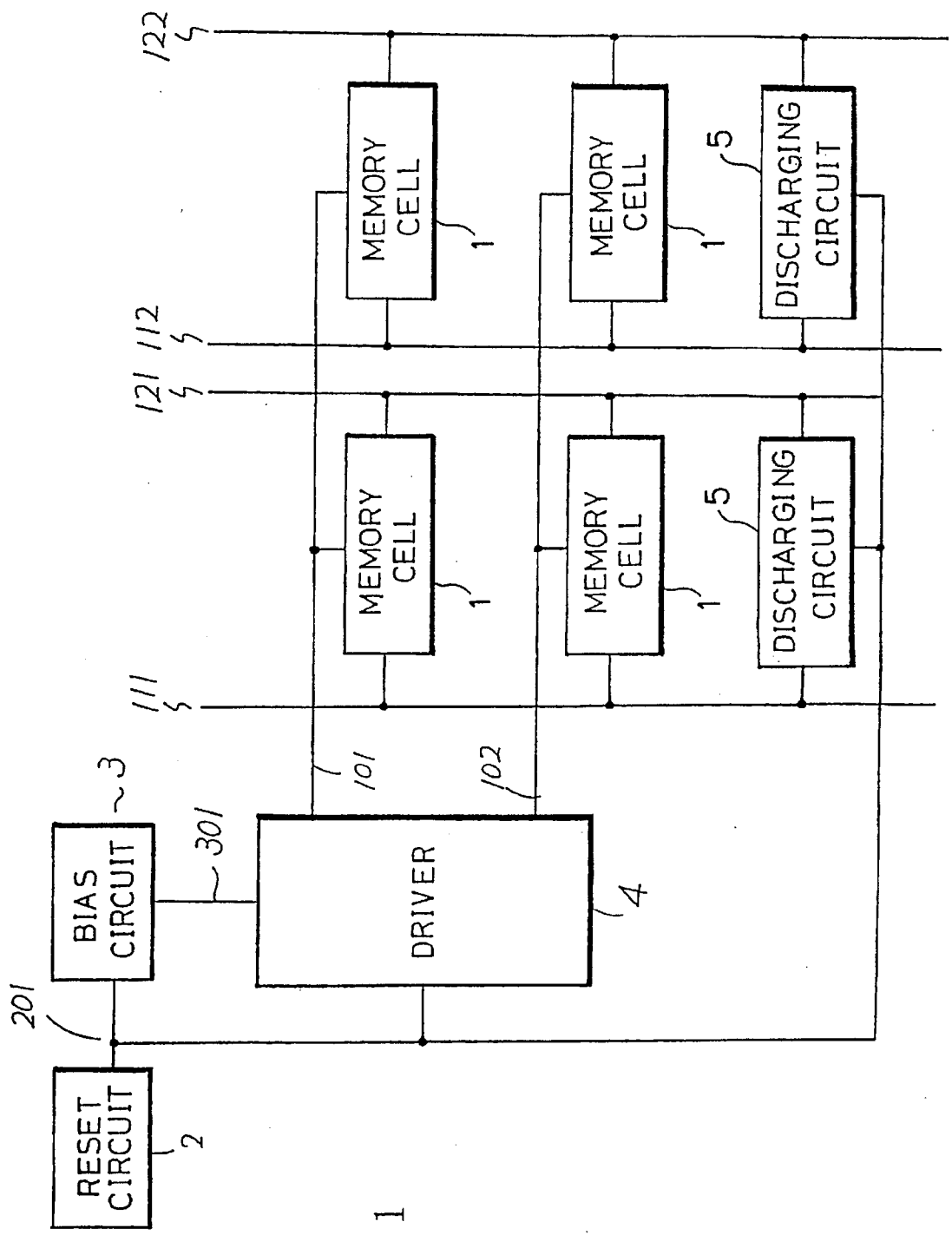
FIG. 1 is a block diagram of an EEPROM according to the present invention.

An embodiment of the present invention is described hereinafter by referring to the drawings. FIG. 1 is an embodiment of the present invention, and is a block diagram of an EEPROM having four memory cells 1. In this example, the EEPROM comprises a reset circuit 2, a bias circuit 3, a driver 4, and two discharging circuits 5, in addition to the memory cells 1.

Figure 2:
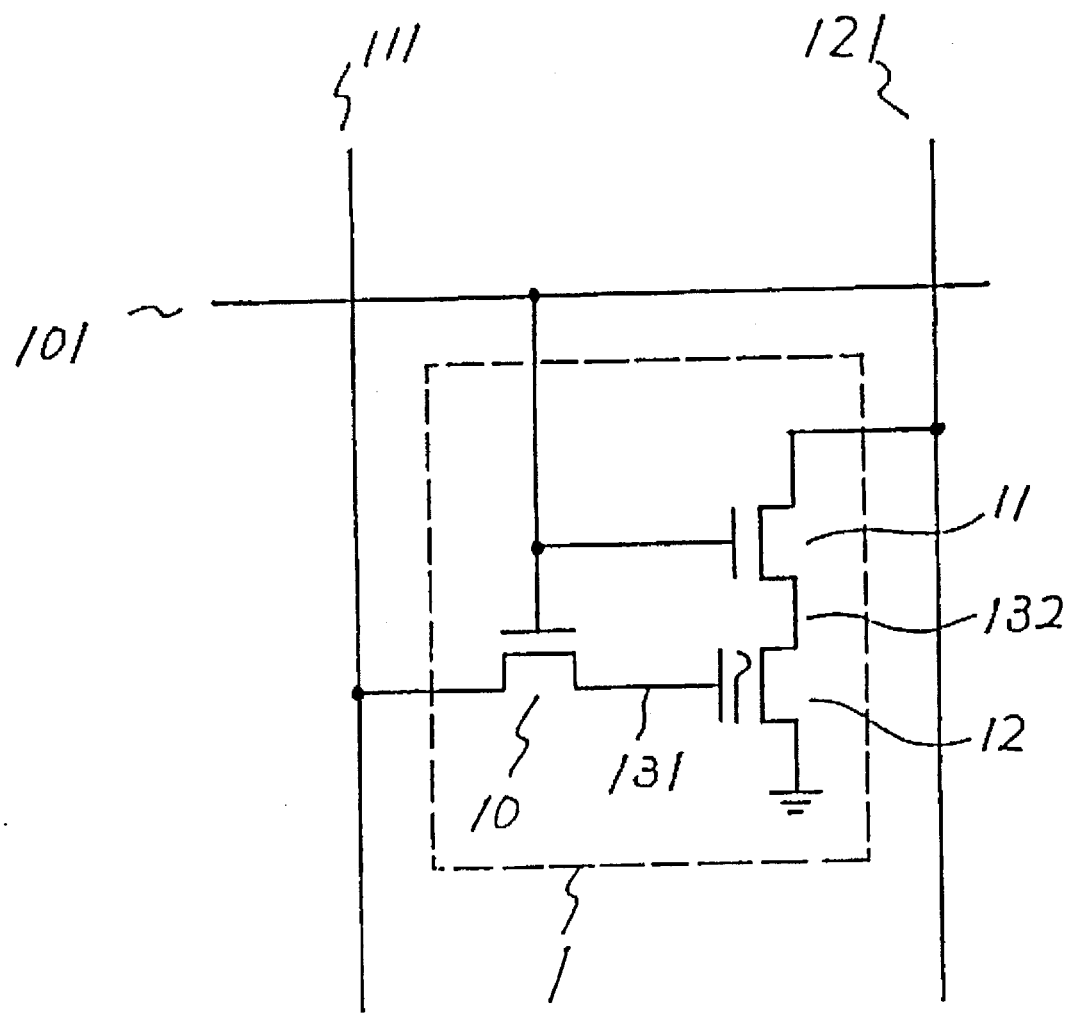
FIG. 2 is a circuit diagram of a memory cell and associated inputs of the prior art EEPROM.

FIG. 2 is a circuit diagram showing the circuit structure of each of the four memory cells 1, and is the same as the memory cell of the prior art EEPROM. A selecting gate MOS transistor 10 is connected to a control line 111. A selecting gate MOS transistor 11 is connected to a bit line 121. The EEPROM further includes a control gate MOS transistor 12.

Figure 3:
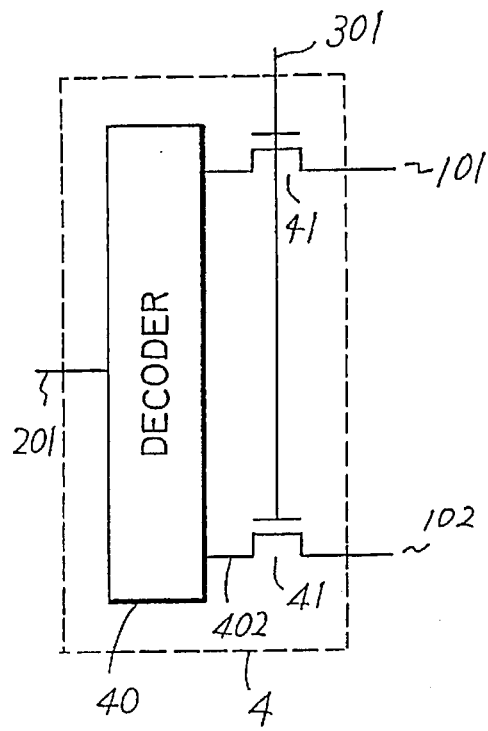
FIG. 3 is a circuit diagram of a driver.

FIG. 3 is a circuit diagram showing the circuit structure of the driver 4. In the present example, the driver is constructed of a decoder 40 and two MOS transistors 41.

Figure 4:
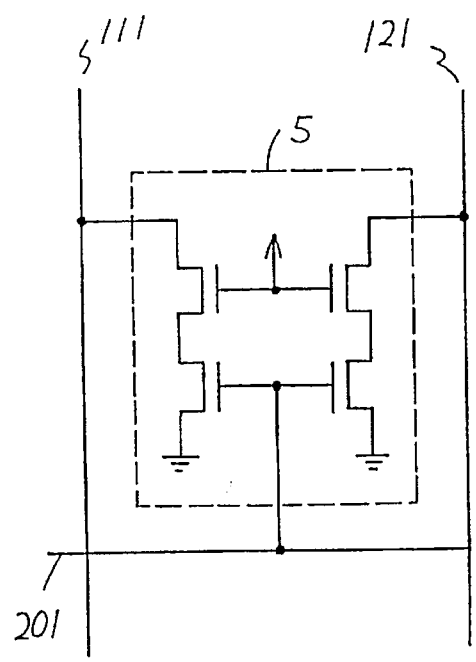
FIG. 4 is a circuit diagram of a discharging circuit.

FIG. 4 is a circuit diagram showing the circuit structure of each of the discharging circuits 5. In the present example, two MOS transistors are connected in series between the control line 111 and ground. Two MOS transistors are connected in series between the bit line 121 and ground. In total, each discharging circuit is made up of four MOS transistors.

When the power is turned on, the reset circuit 2 outputs a reset signal 201 for a given time (several microseconds). When the reset signal 201 is applied to the bias circuit 3, the bias circuit 3 outputs a given voltage (2 V) 301. When the reset signal 201 is applied to the driver 4, the decoder 40 acts to select all word lines inside the driver 4. In this way, a power voltage which is logically high is produced to 401 and 402 and supplied to the sources of the two MOS transistors 41. Since a predetermined voltage delivered from the bias circuit 3 is supplied to the gates 301 of the two MOS transistors 41, a voltage equal to the predetermined voltage supplied from the bias circuit 3 is delivered to the word lines 101 and 102 which are connected to the respective drains of the two MOS transistors 41, respectively. That is, all the word lines are selected and driven with the predetermined voltage. As a result, the selecting gate MOS transistor 10 for the four memory cells 1 is turned on. Consequently, the control line 111 and the control gate 131 conduct.

Similarly, the selecting gate MOS transistor 11 is turned on and so the bit line 121 and the drain 132 of the control gate MOS transistor 12 conduct. When the reset signal 201 is applied to the discharging circuits 5, they start their discharging operation. Then, the control lines 111, 112 and the bit lines 121, 122 are brought to ground level, so that they are electrically discharged. That is, all the control lines, all the control gate lines, all the bit lines, and the drains of all the control MOS transistors are electrically discharged.

The discharging operation is made to persist during the period of the reset signal, or several microseconds. At this time, all the word lines are selected. Therefore, the memory cells are short-circuited to each other via the control lines and the bit lines. All the word lines are selected and driven with a certain voltage, or 2 V, from the bias circuit, rather than with a power voltage that is logically high, the certain voltage being lower than the programmable lowest voltage. Consequently, erroneous erasure and erroneous writing which would otherwise be caused by short circuit is prevented.

As described thus far, the present invention comprises: a reset circuit for producing a reset signal when power is turned on; a bias circuit for producing a certain voltage during period of said reset signal; a driver for selected and driving all word lines with said certain voltage during the period of said reset signal; and discharging circuits for electrically discharging all control lines and all bit lines during the period of said reset signal. When the power is turned off during erasure or writing, electric charge is left due to high voltage. This charge is discharged when the power is turned on. Thus, erroneous erasure, erroneous writing, and erroneous reading are prevented.

What is claimed:

1. Resetting circuitry for resetting a memory circuit having a memory cell, a control line, a bit selecting line and a word selecting line, comprising: reset means for producing a reset signal; and discharge means receptive of the reset signal for providing a ground path to a respective control line and bit selecting line of the memory circuit in response to the reset signal.

2. Resetting circuitry according to claim 1; wherein the reset means produces the reset signal in response to an output signal from a power supply such that the memory circuit is reset upon power up.

3. A method of resetting an electrically erasable memory device, comprising the steps of: applying a signal to a word selecting line of the memory device having a level lower than a signal applied to the word selecting line during the writing of data to the memory device; and simultaneously providing a ground path for discharging a bit selecting line and a control line of the electrically erasable memory device.

* * * * *